United States Patent [19]

Karatsjuka et al.

[11] 4,071,945
[45] Feb. 7, 1978

[54] METHOD FOR MANUFACTURING A SEMICONDUCTOR DISPLAY DEVICE

[76] Inventors: Anatoly Prokofievich Karatsjuba, Zeleny pereulok 3, kv. 56, Moskovskoi oblasti, Ljubertsy-1; Tatyana Georgievna Kmita, Odesskaya ulitsa 17, kv. 63, Moscow; Igor Ivanovich Kruglov, 15 Parkovaya ulitsa 46, korpus 1, kv. 35, Moscow; Vladimir Ivanovich Kurinny, ulitsa Vavilova 58, korpus 2, kv. 90, Moscow; Anatoly Ivanovich Kurnosov, prospekt Mira 190a, kv. 20, Moscow; Igor Veniaminovich Ryzhikov, 9 Parkovaya ulitsa 49, korpus 1, kv. 67, Moscow; Vladimir Vasilievich Judin, Schelkovskoe shosse 87, korpus 1, kv. 195, Moscow, all of U.S.S.R.

[21] Appl. No.: 709,195

[22] Filed: July 27, 1976

Related U.S. Application Data

[62] Division of Ser. No. 461,718, April 17, 1974, Pat. No. 3,982,262.

[51] Int. Cl.² ............................................. B01J 17/00
[52] U.S. Cl. ..................................... 29/578; 29/576 B; 29/569 L; 29/590
[58] Field of Search ................ 29/569 L, 576 B, 578, 29/584, 590; 148/1.5; 357/17, 91

[56] References Cited

U.S. PATENT DOCUMENTS

| 3,629,011 | 12/1971 | Tohi | 357/17 |
| 3,773,566 | 11/1973 | Tsuchimoto | 29/576 B |
| 3,966,501 | 6/1976 | Homura | 357/91 |

*Primary Examiner*—W. Tupman
*Attorney, Agent, or Firm*—Haseltine, Lake & Waters

[57] ABSTRACT

A method for manufacturing a semiconductor indicating instrument or display device employing a silicon carbide crystal having a first ohmic contact with an n-type region and at least one second ohmic contact with a p-type region. Another region is disposed between the regions of opposite types of conductivity. The silicon carbide crystal also has an additional region with structure defects which are clusters with a concentration of $10^{19}$ cm$^{-3}$ to $10^{22}$ cm$^{-3}$, that region adjoining the second ohmic contact and having a thickness greater than that of the p-type region by at least 0.05 m$\mu$. The method is characterized in that, in order to produce the additional region, the p-type region is bombarded with ions of an inert gas with an ion flow density of $3.1 \cdot 10^{13}$ ion/cm²·sec to $1.25 \cdot 10^{14}$ ion/cm²·sec, an ion energy of 10 to 400 keV and an irradiation dose of $1.2 \cdot 10^{16}$ ion/cm² to $6.2 \cdot 10^{17}$ ion/cm².

11 Claims, 9 Drawing Figures

METHOD FOR MANUFACTURING A SEMICONDUCTOR DISPLAY DEVICE

This is a division of application Ser. No. 461,718 filed Apr. 17, 1974, now U.S. Pat. No. 3,982,162.

The present invention relates to a method for manufacturing semiconductor indicating instruments or display devices.

Known at present are different types of semiconductor instruments or display devices intended for the indication and representation of information.

One of the known semiconductor indicating instruments employs a silicon carbide crystal having a p-n junction, a first ohmic contact with the n-type region with a concentration of neutral ions of $1.5 \cdot 10^{18}$ cm$^{-3}$ to $5 \cdot 10^{18}$ cm$^{-3}$, 7 second ohmic contacts with the p-type region with a thickness of 0.1 to 0.3 m$\mu$, producing information to be indicated, and a region having a thickness of 0.5 to 1.2 m$\mu$ and disposed between the n- and p-type regions; there is also an additional region with structural defects, the latter region adjoining the second ohmic contacts.

A disadvantage of the above type of semiconductor indicator instrument is low contrast and poor luminescence efficiency.

Another disadvantage of this semiconductor indicating instrument resides in the presence of a relatively strong conductive coupling between the second ohmic contacts, which results in self-coupling of those second ohmic contacts to which no signal is applied at a given moment of time, i.e., an erroneous representation of information is indicated.

Also known at present is a method for manufacturing a semiconductor indicating instrument, in which a p-type region and another region disposed between an n-type region and the newly formed p-type region are formed in an n-type silicon-carbide crystal. The formation of the above regions is effected by way of introducing an admixture into the silicon carbide crystal. This is followed by the formation of a first ohmic contact with the n-type region and at least one second ohmic contact with the p-type region, after which the p-type region is bombarded with accelerated ions of an inert gas in order to form an additional region with structural defects.

A disadvantage of the above method resides in that the proposed bombardment with argon, nitrogen and oxygen ions does not effectively prevent lateral spread of electric current in the silicon carbide crystal.

It is an object of the present invention to provide a method for making a semiconductor indicating instrument or display device which rules out self-coupling of the second ohmic contacts and ensures a high contrast and luminescence efficiency.

In accordance with the above and other objects, the present invention essentially resides in that in a silicon carbide crystal of a semiconductor indicating instrument or display device wherein the crystal has a first ohmic contact with the n-type region and at least one second ohmic contact with the p-type region, constituting an area for information to be indicated, a compensated region with a luminescence activator is disposed between the regions of different types of conductivity, and also having an additional region with structural defects adjoining the second ohmic contact. The additional region has a thickness greater than that of the p-type region by at least 0.05 m$\mu$, the structural defects therein forming clusters with a concentration of $10^{19}$ cm$^{-3}$ to $10^{22}$ cm$^{-3}$, as will be explained later.

It is recommended that in the proposed device the additional region consists of two layers, the first layer directly adjoining the second ohmic contact, having a depth greater than that of the p-type region by at least 0.05 m$\mu$, and also being a dielectric produced on the basis of silicon carbide.

The present invention essentially resides in a method for manufacturing a semiconductor indicating instrument or device in which a p-type region and a region disposed between an n-type region and the newly formed p-type region are formed in an n-type silicon-carbide crystal. The formation is effected by way of introducing an admixture into the silicon carbide crystal, which is followed by the formation of a first ohmic contact with the n-type region and at least one second ohmic contact with the p-type region, after which the p-type region adjoining the second ohmic contact is bombarded with accelerated ions of an inert gas in order to form an additional region. The bombardment is effected, in accordance with the invention, at a density of the ion flow of $3.1 \cdot 10^{13}$ ion/cm$^2$·sec to $1.25 \cdot 10^{14}$ ion/cm$^2$·sec, an ion energy of 10 to 400 keV and an irradiation dose of $1.2 \cdot 10^{16}$ ion/cm$^2$ to $6.2 \cdot 10^{17}$ ion/cm$^2$.

It is recommended that in the case of utilizing argon, the ion energy be between 20 and 100 keV and the irradiation dose between $6.2 \cdot 10^{15}$ ion/cm$^2$ and $3.1 \cdot 10^{17}$ ion/cm$^2$.

It is expedient that in the case of utilizing krypton, the ion energy be between 40 and 200 keV and the irradiation dose between $3.1 \cdot 10^{16}$ ion/cm$^2$ and $6.2 \cdot 10^{16}$ ion/cm$^2$.

It is expedient that in the case of utilizing xenon, the ion energy be between 80 and 400 keV and the irradiation dose between $1.2 \cdot 10^{16}$ ion/cm$^2$ and $3.1 \cdot 10^{16}$ ion/cm$^2$.

It is also expedient that the bombardment with ions of an inert gas, in order to produce an additional two-layer region, be followed by bombardment with accelerated ions of a chemically active element, this bombardment taking place at an ion flow density of $6.2 \cdot 10^{13}$ ion/cm$^2$·sec to $3.1 \cdot 10^{14}$ ion/cm$^2$·sec, with an ion energy of 10 to 250 keV and an irradiation dose of $1.2 \cdot 10^{17}$ ion/cm$^2$ to $6.2 \cdot 10^{18}$ ion/cm$^2$.

It is further expedient that in the case of using atomic nitrogen ions, the ion energy be between 10 and 100 keV and the irradiation dose between $4 \cdot 10^{17}$ ion/cm$^2$ and $2 \cdot 10^{18}$ ion/cm$^2$.

It is expedient that in the case of using diatomic nitrogen ions the ion energy be between 20 and 200 keV and the irradiation dose, between $2 \cdot 10^{17}$ ion/cm$^2$ and $1 \cdot 10^{18}$ ion/cm$^2$.

It is expedient that in the case of using atomic oxygen ions, the ion energy be between 20 and 100 keV and the irradiation dose between $3.1 \cdot 10^{17}$ ion/cm$^2$ and $1.2 \cdot 10^{18}$ ion/cm$^2$.

It is expedient that in the case of using diatomic oxygen ions, the ion energy be between 40 and 250 keV and the irradiation dose between $1.2 \cdot 10^{17}$ ion/cm$^2$ and $6.2 \cdot 10^{17}$ ion/cm$^2$.

It is expedient that in the case of using carbon ions, the ion energy be between 20 and 200 keV and the irradiation dose between $6.2 \cdot 10^{17}$ ion/cm$^2$ and $6.2 \cdot 10^{18}$ ion/cm$^2$.

Other objects and advantages of the present invention will be more fully understood from the following detailed description of specific embodiments thereof when read in conjunction with the accompanying drawings, wherein.

Figure 1:
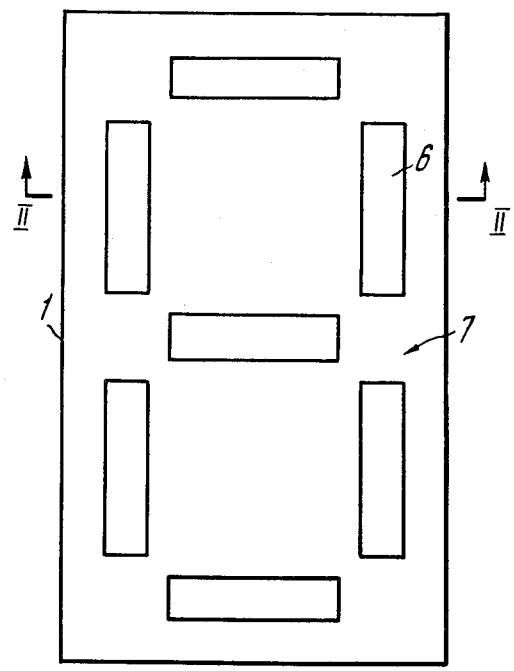
FIG. 1 shows the structure of a semiconductor indicating instrument or display device manufactured in accordance with the invention.
Figure 2:
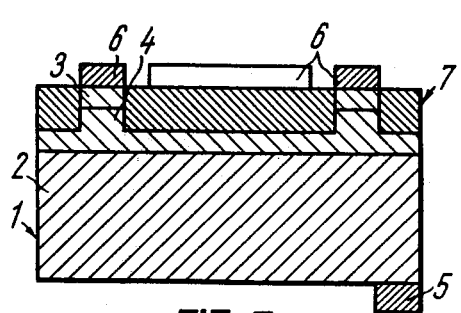
FIG. 2 is a section along line 2—2 of FIG. 1.

Referring now to the attached drawings, a silicon carbide crystal 1 (FIGS. 1 and 2) has a thickness of 350 mμ and includes an n-type region 2 (FIG. 2) with a concentration of $3 \cdot 10^{18}$ cm$^{-3}$ of uncompensated nitrogen atoms, a p-type region 3 with a thickness of 0.2 mμ, containing atoms of aluminum, and a region 4 with a thickness of 0.6 mμ disposed between the regions 2 and 3 of opposite types of conductivity, the region 4 containing boron atoms that serve as a luminescence activator.

Adjoining the n-type region 2 is a first ohmic contact 5. Adjoining the p-type region 3 are 7 second metal ohmic contacts 6, the size and shape thereof determining the topology of light-emitting patches which are adapted to process information to be indicated.

An additional region 7 of silicon carbide lies between the contacts 6, the region 7 having a thickness larger by at least 0.05 mμ than that of the p-type region 3. The region 7 includes clusters of radiation defects with a concentration from $10^{19}$ cm$^{-3}$ to $10^{22}$ cm$^{-3}$.

The additional region 7 features high electrical resistivity that prevents lateral spread of electric current in the silicon carbide crystal 1 and thus improves contrast and luminescence efficiency.

Figure 3:
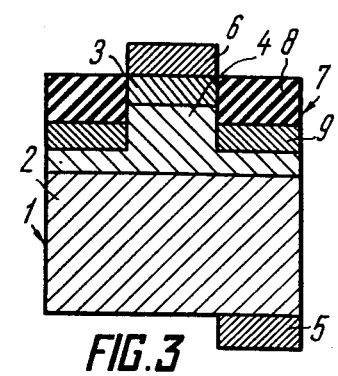
FIG. 3 shows the structure of a semiconductor indicating instrument with a two-layer additional region, in accordance with the invention.

In accordance with another embodiment of the proposed semiconductor indicating instrument or display device, the additional region 7 consists of two layers. A first layer 8 (FIG. 3) adjoins the second ohmic contacts 6, is a dielectric incorporating atoms of silicon, carbon, nitrogen or oxygen, and having a thickness by at least 0.05 mμ greater than that of the p-type region 3, whereas a second layer 9 includes structural defects or damages which are of radiation defects with a concentration of $10^{19}$ cm$^{-3}$ to $10^{22}$ cm$^{-3}$.

Figure 4:
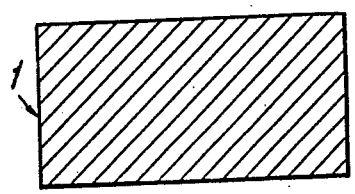
FIGS. 4, 5, 6, 7, 8 and 9 illustrate operations of the inventive method for manufacturing the semiconductor indicating instruments.
Figure 5:
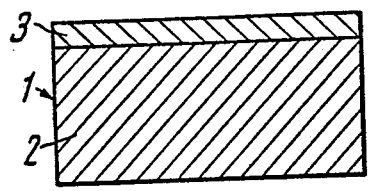
Figure 6:
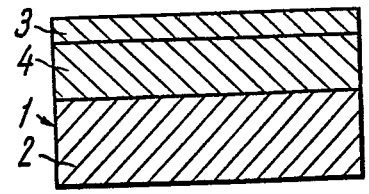

The proposed method for manufacturing the above semiconductor indicating instrument or display device is carried out as follows. Introduced by way of diffusion at a temperature between 2,000° and 2,300° C over a period from 10 minutes to 4 hours into the silicon carbide crystal 1 (FIG. 4) is an acceptor impurity which is aluminum. The impurity is introduced to a depth of 0.1 to 0.3 mμ, whereby the p-type region 3 (FIG. 5) is formed. Then, by way of diffusion at a temperature between 1,920° and 1,980° C and over a period from 1 minute to 10 minutes, one introduces boron into the silicon-carbide crystal 1. Boron is introduced to a depth of 0.3 to 1.2 mμ, whereby the region 4 is formed (FIG. 6).

Figure 7:
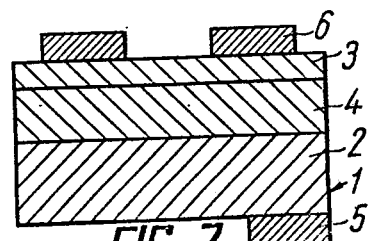

Then the 7 second ohmic contacts 6 (FIG. 7) are applied to the p-type region 3, and one first ohmic contact 5 to the n-type region 2, which is effected by way of deposition of titanium and nickel, the thickness of the deposition being 0.05 to 0.1 mμ and 0.5 to 1.0 mμ, respectively.

Figure 8:
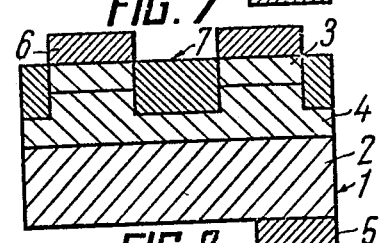

After that the silicon carbide crystal 1 is bombarded, on the side of the 7 second ohmic contacts 6, with accelerated ions of an inert gas at an ion flow density of $3.1 \cdot 10^{13}$ ion/cm$^2$·sec to $1.25 \cdot 10^{14}$ ion/cm$^2$·sec, an ion energy of 10 to 400 keV and an irradiation dose of $1.2 \cdot 10^{16}$ ion/cm$^2$ to $6.2 \cdot 10^{17}$ ion/cm$^2$ in order to produce the additional region 7 (FIG. 8) with structural defects in the form of clusters of radiation defects with a concentration from $10^{19}$ cm$^{-3}$ to $10^{22}$ cm$^{-3}$.

When the neutral gas is neon, the ion energy is to be between 10 and 50 keV, and the irradiation dose between $1.2 \cdot 10^{17}$ ion/cm$^2$ and $6.2 \cdot 10^{17}$ ion/cm$^2$.

If in this case the thickness of the p-type region 3 is between 0.05 and 0.2 mμ, the neon ion energy is to be 10 keV, the ion flow density $3.1 \cdot 10^{13}$ ion/cm$^2$·sec, and the irradiation dose $1.2 \cdot 10^{17}$ ion/cm$^2$. If in the latter case the thickness of the p-type region 3 is between 0.2 and 0.5 mμ, the neon ion energy is to be 30 keV, the ion flow density $6.2 \cdot 10^{13}$ ion/cm$^2$·sec, and the irradiation dose $3.1 \cdot 10^{17}$ ion/cm$^2$.

If the thickness of the p-type region 3 is greater than 0.5 mμ, the neon ion energy is to be 50 keV, the ion flow density $1.25 \cdot 10^{14}$ ion/cm$^2$·sec, and the irradiation dose $6.2 \cdot 10^{17}$ ion/cm$^2$.

When the inert gas consists of ions of argon, krypton and xenon, the ion energy, ion flow density and irradiation dose are selected in accordance with Table 1 that will follow, depending upon the thickness of the p-type region 3.

Inert gas ions are introduced into the regions 3 (FIG. 7) and 4; in the course of deceleration, they form displacement cascades therein. As a result, clusters of radiation defects are formed which are quenchers of electroluminescence and hooks for free charge carriers.

With the above-indicated bombardment conditions, the thickness of the additional region 7 (FIG. 8) containing the clusters is greater than that of the p-type region 3 by at least 0.05 mμ, the cluster concentration therein being $10^{19}$ cm$^{-3}$ to $10^{22}$ cm$^{-3}$.

In the zone of the second ohmic contacts 6 (FIG. 7) the deceleration of accelerated neon ions takes place inside the second ohmic contacts 6, so that the accelerated neon ions do not reach the surface of the silicon carbide crystal 1.

Figure 9:
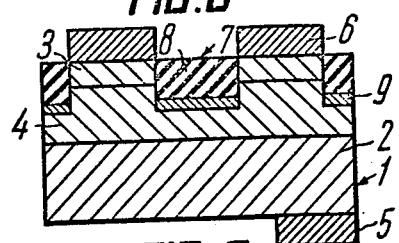

According to another embodiment of the proposed semiconductor indicating instrument or display device, the above bombardment of the silicon carbide crystal 1 with accelerated ions of an inert gas on the side of the 7 second ohmic contacts 6 is followed by a bombardment with accelerated ions of chemically active elements which implant into the silicon carbide and form with the silicon atoms a dielectric compound, whereby the two-layer additional region 7 is formed (FIG. 9). Used for this purpose are ions of nitrogen, oxygen and carbon. The bombardment is carried out at an ion flow density of $6.2 \cdot 10^{13}$ ion/cm$^2$·sec to $3.1 \cdot 10^{14}$ ion/cm$^2$·sec, an ion energy of 10 to 250 keV, and an irradiation dose of $1.2 \cdot 10^{17}$ ion/cm$^2$ to $6.2 \cdot 10^{18}$ ion/cm$^2$.

With the use of atomic ions of nitrogen the ion energy is between 10 and 100 keV, and the irradiation dose between $4 \cdot 10^{17}$ ion/cm$^2$ and $1 \cdot 10^{18}$ ion/cm$^2$.

If the thickness of the p-type region 3 is between 0.05 and 0.2 mμ, the energy of atomic ions is 10 keV, the ion flow density $6.2 \cdot 10^{13}$ ion/cm$^2$·sec, and the irradiation dose $4 \cdot 10^{17}$ ion/cm$^2$.

If the thickness of the p-type region 3 is between 0.2 and 0.5 mμ, the energy of atomic ions is 40 keV, the ion flow density $1.25 \cdot 10^{14}$ ion/cm$^2$·sec, and the irradiation dose $1 \cdot 10^{18}$ ion/cm$^2$.

In case the thickness of the p-type region is more than 0.5 mμ, the ion energy is 100 keV, the ion flow density, $3.1 \cdot 10^{14}$ ion/cm$^2$·sec, and the irradiation dose $2 \cdot 10^{18}$ ion/cm$^2$.

In all the above cases, the first layer 8 of the additional region 7 is a dielectric of the silicon nitride type.

In the case of using diatomic ions of nitrogen, the first layer 8 of the additional region 7 is a dielectric of the silicon nitride type; in the case of using atomic and diatomic ions of oxygen, the first layer 8 of the additional region 7 is a dielectric of the silicon oxide type; in the case of using atomic ions of carbon, the first layer 8 of the additional region 7 is a dielectric compound based upon silicon carbide with an increased carbon content.

In all the above cases, the ion energy, ion flow density and irradiation dose are selected in accordance with Table 2, also to follow, depending upon the thickness of the p-type region 3.

Accelerated ions of a chemically active element are introduced into the surface portion of the additional region 7 (FIG. 8), containing the clusters and, interacting with atoms of silicon, form the first layer 8 (FIG. 9) of the additional region 7 in the form of a dielectric compound on the basis of silicon carbide.

The first layer 8 has a thickness which is greater than that of the p-type region 3 by at least 0.05 m$\mu$; hence, the boundary between the p-type region 3 and the region 4 is enveloped by a dielectric insulator, which rules out any direct contact between that boundary and the second layer 9 including structural defects in the form of clusters of radiation defects.

The semiconductor device can form all the numerals from 0 to 9; the luminescence color is yellow.

As a signal is applied to the first ohmic contact 5 (FIG. 2) and some of the second ohmic contacts 6, an injection of minority charge carriers takes place, which is accompanied by their recombination and the production of luminescence in the portion of the region 4 disposed above the second ohmic contact 6.

The clusters with a concentration of $10^{19} - 10^{22}$ cm$^{-3}$ contained in the additional region 7 of the silicon carbide crystal 1 form compensating centers which quench electroluminescence in the additional region 7. Due to the fact that free charge carriers are hooked by the compensating centers, the additional region 7 has a high resistance, which rules out effectively and completely any conductive coupling between the second ohmic contacts 6 and makes for a high contrast and efficiency of luminescence.

The presence of the first layer 8 (FIG. 3) provides reliable insulation of the boundary between the p-type region 3 and the region 4. This reduces leakage currents, as compared to the first embodiment of the proposed semiconductor device, and raises the brightness of luminescence with low current densities.

The brightness of the devices produced by the proposed method is 100 – 350 nit at a current density of 3.5 – 4.5 a/cm$^2$. The devices are operable within a temperature range from $-60°$ to $+125°$ C.

Table 1

| Type of Ion | Parameter | Bombardment Conditions with p-type Region Thickness | | |
|---|---|---|---|---|
| | | 0.05 – 0.20 mu | 0.20 – 0.5 mu | over 0.5 mu |
| $20_{Ne}$ | Ion Energy, keV | 10 | 30 | 50 |
| | Ion Flow Density, ion/cm$^2$ · sec | $3.1 \cdot 10^{13}$ | $6.2 \cdot 10^{13}$ | $1.25 \cdot 10^{14}$ |
| | Irradiation Dose, ion/cm$^2$ | $1.2 \cdot 10^{17}$ | $3.1 \cdot 10^{17}$ | $6.2 \cdot 10^{17}$ |
| $40_{Ar}$ | Ion Energy, keV | 20 | 40 | 100 |

Table 1-continued

| Type of Ion | Parameter | Bombardment Conditions with p-type Region Thickness | | |
|---|---|---|---|---|
| | | 0.05 – 0.20 mu | 0.20 – 0.5 mu | over 0.5 mu |
| | Ion Flow Density, ion/cm$^2$ · sec | $3.1 \cdot 10^{13}$ | $6.2 \cdot 10^{13}$ | $1.25 \cdot 10^{14}$ |
| | Irradiation Dose: ion/cm$^2$ | — | — | — |
| $84_{Xe}$ | Ion Energy, keV | 40 | 100 | 200 |
| | Ion Flow Density, ion/cm$^2$ · sec | $3.1 \cdot 10^{13}$ | $6.2 \cdot 10^{13}$ | $1.25 \cdot 10^{14}$ |
| | Irradiation Dose, ion/cm$^2$ | $3.1 \cdot 10^{16}$ | $4.5 \cdot 10^{16}$ | $6.2 \cdot 10^{16}$ |
| $132_{Kr}$ | Ion Energy, keV | 80 | 200 | 400 |
| | Ion Flow Density, ion/cm$^2$ · sec | $3.1 \cdot 10^{13}$ | $6.2 \cdot 10^{13}$ | $1.25 \cdot 10^{14}$ |
| | Irradiation Dose, ion/cm$^2$ | $1.2 \cdot 10^{16}$ | $1.8 \cdot 10^{16}$ | $3.1 \cdot 10^{16}$ |

Table 2

| Type of Ion | Parameter | Bombardment Conditions with p-type Region Thickness | | |
|---|---|---|---|---|
| | | 0.05–0.20 mu | 0.20–0.5 mu | 0.5 mu |
| $14_N$ | Ion Energy, keV | 10 | 40 | 100 |
| | Ion Flow Density, ion/cm$^2$ · sec | $6.2 \cdot 10^{13}$ | $1.25 \cdot 10^{14}$ | $3.1 \cdot 10^{14}$ |
| | Irradiation Dose, ion/cm$^2$ | $4.10^{17}$ | $1 \cdot 10^{18}$ | $2 \cdot 10^{18}$ |
| $14_{N_2}$ | Ion Energy, keV | 20 | 80 | 200 |
| | Ion Flow Density, ion/cm$^2$ · sec | $6.2 \cdot 10^{13}$ | $1.25 \cdot 10^{14}$ | $3.1 \cdot 10^{14}$ |
| | Irradiation Dose, ion/cm$^2$ | $2 \cdot 10^{17}$ | $6.2 \cdot 10^{17}$ | $1 \cdot 10^{18}$ |
| $16_O$ | Ion Energy, keV | 20 | 40 | 100 |
| | Ion Flow Density, ion/cm$^2$ · sec | $6.2 \cdot 10^{13}$ | $1.25 \cdot 10^{14}$ | $3.1 \cdot 10^{14}$ |
| | Irradiation Dose, ion/cm$^2$ | $3.1 \cdot 10^{17}$ | $6.2 \cdot 10^{17}$ | $1.2 \cdot 10^{18}$ |
| $16_{O_2}$ | Ion Energy, keV | 40 | 100 | 250 |
| | Ion Flow Density, ion/cm$^2$ · sec | $6.2 \cdot 10^{13}$ | $1.25 \cdot 10^{14}$ | $3.1 \cdot 10^{14}$ |
| | Irradiation Dose, ion/cm$^2$ | $1.2 \cdot 10^{17}$ | $3.1 \cdot 10^{17}$ | $6.2 \cdot 10^{18}$ |
| $12_C$ | Ion Energy, KeV | 20 | 40 | 200 |
| | Ion Flow Density, ion/cm$^2$ · sec | $6.2 \cdot 10^{13}$ | $1.25 \cdot 10^{14}$ | $3.1 \cdot 10^{14}$ |
| | Irradiation Dose ion/cm$^2$ | $6.2 \cdot 10^{17}$ | $1.2 \cdot 10^{17}$ | $6.2 \cdot 10^{18}$ |

What is claimed is:

1. A method for manufacturing a semiconductor display device, comprising the steps of: forming in an n-type silicon-carbide crystal a diffused p-type region and a diffused region with a luminescence activator disposed between an n-type region and the newly formed p-type region; the formation being effected by way of introducing an impurity into the crystal, followed by the formation of a first ohmic contact attached to the n-type region, and at least one second ohmic contact attached to the p-type region; thereafter bombarding the p-type region with ions of an inert gas in order to produce an additional region of silicon carbide, incorporating clusters of structural radiation defects with a concentration of $10^{19}$ cm$^{-3}$ to $10^{22}$ cm$^{-3}$, at an ion-flow density of $3.1 \cdot 10^{13}$ ion/cm$^2$·sec to $1.25 \cdot 10^{14}$ ion/cm$^2$·sec, an ion energy of 10 to 400 keV, and an irradiation dose of $1.2 \cdot 10^{16}$ ion/cm$^2$ to $6.2 \cdot 10^{17}$ ion/cm$^2$.

2. The method as defined in claim 1, wherein neon is used as the inert gas, the ion energy being between 10 and 50 keV, and the irradiation dose between $1.2 \cdot 10^{17}$ ion/cm$^2$ and $6.2 \cdot 10^{17}$ ion/cm$^2$.

3. The method as defined in claim 1, wherein argon is used as the inert gas, the ion energy being between 20 and 100 keV, and the irradiation dose between $6.2 \cdot 10^{16}$ ion/cm$^2$ to $3.1 \cdot 10^{17}$ ion/cm$^2$.

4. The method as defined in claim 1, wherein krypton is used as the inert gas, the ion energy being between 40 and 200 keV, and the irradiation dose between $3.1 \cdot 10^{16}$ ion/cm$^2$ and $6.2 \cdot 10^{16}$ ion/cm$^2$.

5. The method as defined in claim 1, wherein xenon is used as the inert gas, the ion energy being between 80 and 400 keV, and the irradiation dose between $1.2 \cdot 10^{16}$ ion/cm$^2$ and $3.1 \cdot 10^{16}$ ion/cm$^2$.

6. The method as defined in claim 1, wherein said bombarding step with ions of the inert gas is followed by bombardment with accelerated ions of a chemically active element at an ion-flow density of $6.2 \cdot 10^{13}$ ion/cm$^2 \cdot$sec to $3.1 \cdot 10^{14}$ ion/cm$^2 \cdot$sec, an ion energy of 10 to 250 keV, and an irradiation dose of $1.2 \cdot 10^{17}$ ion/cm$^2$ to $6.2 \cdot 10^{18}$ ion/cm$^2$.

7. The method as defined in claim 6, whereion ions of nitrogen are used as the active element, the ion energy being between 10 and 100 keV, and the irradiation dose between $4 \cdot 10^{17}$ ion/cm$^2$ and $2 \cdot 10^{18}$ ion/cm$^2$.

8. The method as defined in claim 6, wherein diatomic ions of nitrogen are used as the active element, the ion energy being between 20 and 200 keV, and the irradiation dose between $2 \cdot 10^{17}$ ion/cm$^2$ and $1 \cdot 10^{18}$ ion/cm$^2$.

9. The method as defined in claim 6, wherein atomic ions of oxygen are used as the active element, the ion energy being between 20 and 100 keV, and the irradiation dose between $3.1 \cdot 10^{17}$ ion/cm$^2$ and $1.2 \cdot 10^{18}$ ion/cm$^2$.

10. The method as defined in claim 6, wherein diatomic ions of oxygen are used as the active element, the ion energy being between 40 and 250 keV, and the irradiation dose between $1.2 \cdot 10^{17}$ ion/cm$^2$ and $6.2 \cdot 10^{17}$ ion/cm$^2$.

11. The method as defined in claim 6, wherein ions of carbon are used as the active element, the ion energy being between 20 and 200 keV, and the irradiation dose between $6.2 \cdot 10^{17}$ ion/cm$^2$ and $6.2 \cdot 10^{18}$ ion/cm$^2$.

* * * * *